(12) United States Patent
Lee et al.

(10) Patent No.: US 11,574,829 B2
(45) Date of Patent: Feb. 7, 2023

(54) WAFER RACK AND VERTICAL WAFER BOAT HAVING THE SAME

(71) Applicant: XIA TAI XIN SEMICONDUCTOR (QING DAO) LTD., Qingdao (CN)

(72) Inventors: Eun-Joung Lee, Singapore (SG); Sung-Ki Kim, Singapore (SG); Se-Keun Kwak, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 395 days.

(21) Appl. No.: 16/788,082

(22) Filed: Feb. 11, 2020

(65) Prior Publication Data

US 2021/0143027 A1 May 13, 2021

(30) Foreign Application Priority Data

Nov. 11, 2019 (CN) .......................... 201911097103.3

(51) Int. Cl.
*H01L 21/673* (2006.01)
*C23C 16/458* (2006.01)

(52) U.S. Cl.
CPC ...... *H01L 21/6732* (2013.01); *C23C 16/4587* (2013.01)

(58) Field of Classification Search
CPC ... H01L 21/6732; H01L 21/673–67346; C23C 16/4587
USPC ................................. 29/281.5; 118/715–733; 156/345.1–345.55
See application file for complete search history.

(56) References Cited

U.S. PATENT DOCUMENTS

| | | | |
|---|---|---|---|
| 5,387,067 A * | 2/1995 | Grunes | H01L 21/67778 414/217 |
| 5,782,361 A * | 7/1998 | Kakizaki | H01L 21/6732 206/508 |
| 5,921,773 A * | 7/1999 | Lee | H01L 21/67303 432/253 |
| 6,133,121 A * | 10/2000 | Tsunashima | H01L 21/67306 438/584 |
| 6,699,401 B1 * | 3/2004 | Horiuchi | C04B 35/573 164/91 |
| 7,181,132 B2 * | 2/2007 | De Ridder | G01R 31/2893 392/407 |
| 2005/0269242 A1 * | 12/2005 | Crisp | H01L 21/67333 206/710 |
| 2006/0011507 A1 * | 1/2006 | Uchida | H01L 21/67343 206/711 |
| 2008/0185308 A1 * | 8/2008 | Herzog | H01L 21/67309 206/445 |
| 2018/0130692 A1 * | 5/2018 | Ishino | G03F 7/20 |

* cited by examiner

*Primary Examiner* — Charlee J. C. Bennett
(74) *Attorney, Agent, or Firm* — ScienBiziP, P.C.

(57) ABSTRACT

A vertical wafer boat for a diffusion process is provided. The vertical wafer boat includes a plurality of wafer racks. Each of the plurality of wafer racks includes a vertical support member and a plurality of wafer support arms. The plurality of wafer support arms extends from a sidewall of the vertical support member. Each of the wafer support arms includes a support body and a ledge. The support body is located between the vertical support member and the ledge. Centers of the support body and the ledge are horizontally aligned. A vertical thickness of the ledge is smaller than a vertical thickness of the support body.

10 Claims, 5 Drawing Sheets

WAFER RACK AND VERTICAL WAFER BOAT HAVING THE SAME

CROSS REFERENCE TO RELATED APPLICATION(S)

The present application claims priority and the benefit of Chinese Application No. 201911097103.3, filed on Nov. 11, 2019, the contents of which are incorporated herein by reference.

FIELD

The present disclosure relates to semiconductor wafer carrier and more specifically to a vertical wafer boat.

BACKGROUND

In order to perform a thin film formation process, wafers are loaded on the vertical wafer boat. Subsequently, the vertical wafer boat is vertically placed into a diffusion device such as a low pressure chemical vapor deposition (LPCVD) apparatus for performing a chemical reaction.

The vertical wafer boat has slots for carrying the wafers. Particles or chemicals in the diffusion device may cause erosion to the slots. Replacement of the wafer boat increases the cost of the thin film formation process.

SUMMARY

The following presents a summary of examples of the present disclosure in order to provide a basic understanding of at least some of its examples. This summary is not an extensive overview of the present disclosure. It is not intended to identify key or critical elements of the present disclosure or to delineate the scope of the present disclosure. The following summary merely presents some concepts of the present disclosure in a general form as a prelude to the more detailed description provided below.

In one example, a wafer rack for holding a plurality of wafers includes a vertical support member, and a plurality of wafer support arms. The plurality of wafer support arms extends from a sidewall of the vertical support member. Each of the wafer support arms includes a support body and a ledge. The support body is located between the vertical support member and the ledge. Centers of the support body and the ledge are horizontally aligned. A vertical thickness of the ledge is smaller than a vertical thickness of the support body.

In another example, a vertical wafer boat for a diffusion process includes a plurality of wafer racks. Each of the plurality of wafer racks includes a vertical support member and a plurality of wafer support arms. The plurality of wafer support arms extends from a sidewall of the vertical support member. Each of the wafer support arms includes a support body and a ledge. The support body is located between the vertical support member and the ledge. Centers of the support body and the ledge are horizontally aligned. A vertical thickness of the ledge is smaller than a vertical thickness of the support body.

The details of one or more examples are set forth in the accompanying drawings and description below.

BRIEF DESCRIPTION OF THE DRAWINGS

The accompanying drawings illustrate one or more implementations of the present disclosure and, together with the written description, explain the principles of the present disclosure. Wherever possible, the same reference numbers are used throughout the drawings referring to the same or like elements of an implementation.

DETAILED DESCRIPTION

Figure 1:
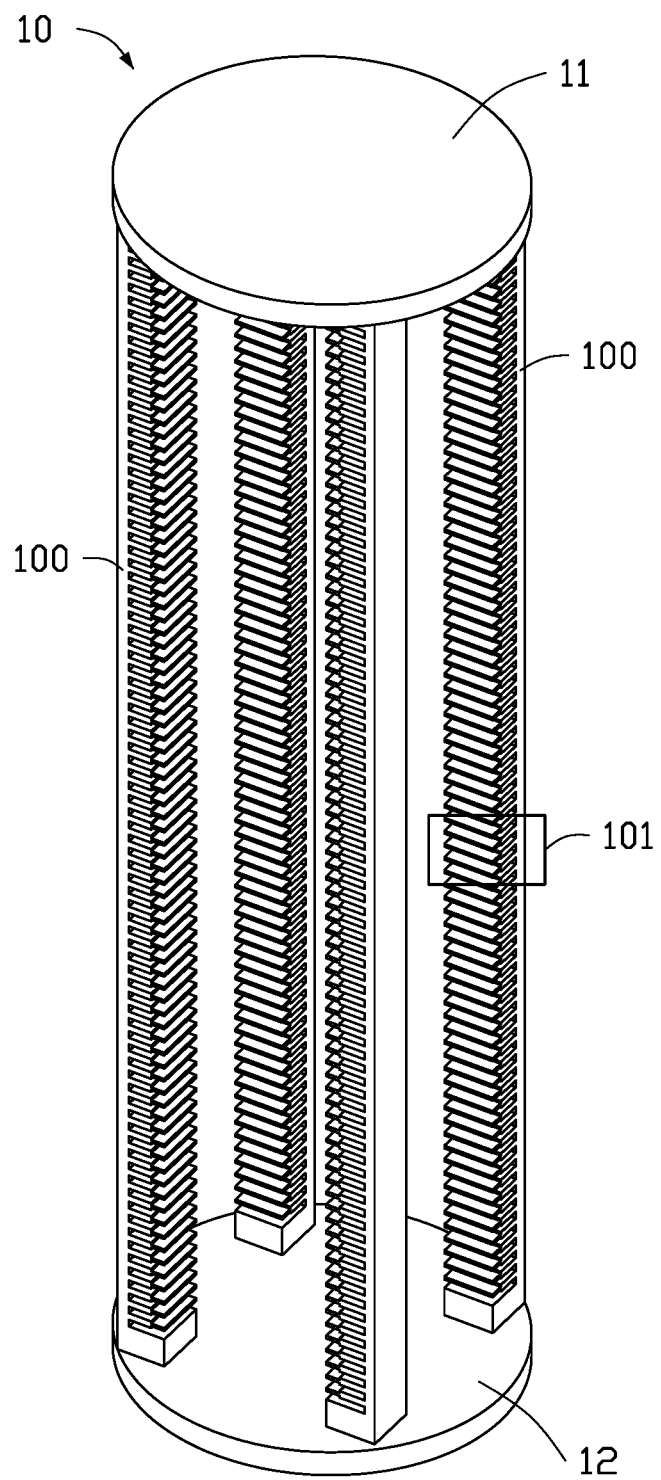
FIG. 1 is a perspective view of a vertical wafer boat in accordance with an implementation of the present disclosure.

To facilitate an understanding of the principles and features of the various implementations of the present disclosure, various illustrative implementations are explained below. Although exemplary implementations of the present disclosure are explained in detail, it is to be understood that other implementations are contemplated. Accordingly, it is not intended that the present disclosure is limited in its scope to the details of construction and arrangement of components set forth in the following description or illustrated in the drawings. The present disclosure is capable of other implementations and of being practiced or carried out in various ways.

FIG. 1 illustrates a perspective view of a vertical wafer boat 10 in accordance with an implementation of the present disclosure. The vertical wafer boat 10 includes a first plate 11 (or a top plate), a plurality of wafer racks 100, and a second plate 12 (or a bottom plate). The plurality of wafer racks 100 are configured to be connected to the first plate 11 and the second plate 12. In some examples, the vertical wafer boat 10 is loaded with wafers and vertically placed into a diffusion furnace (not shown).

Figure 2:
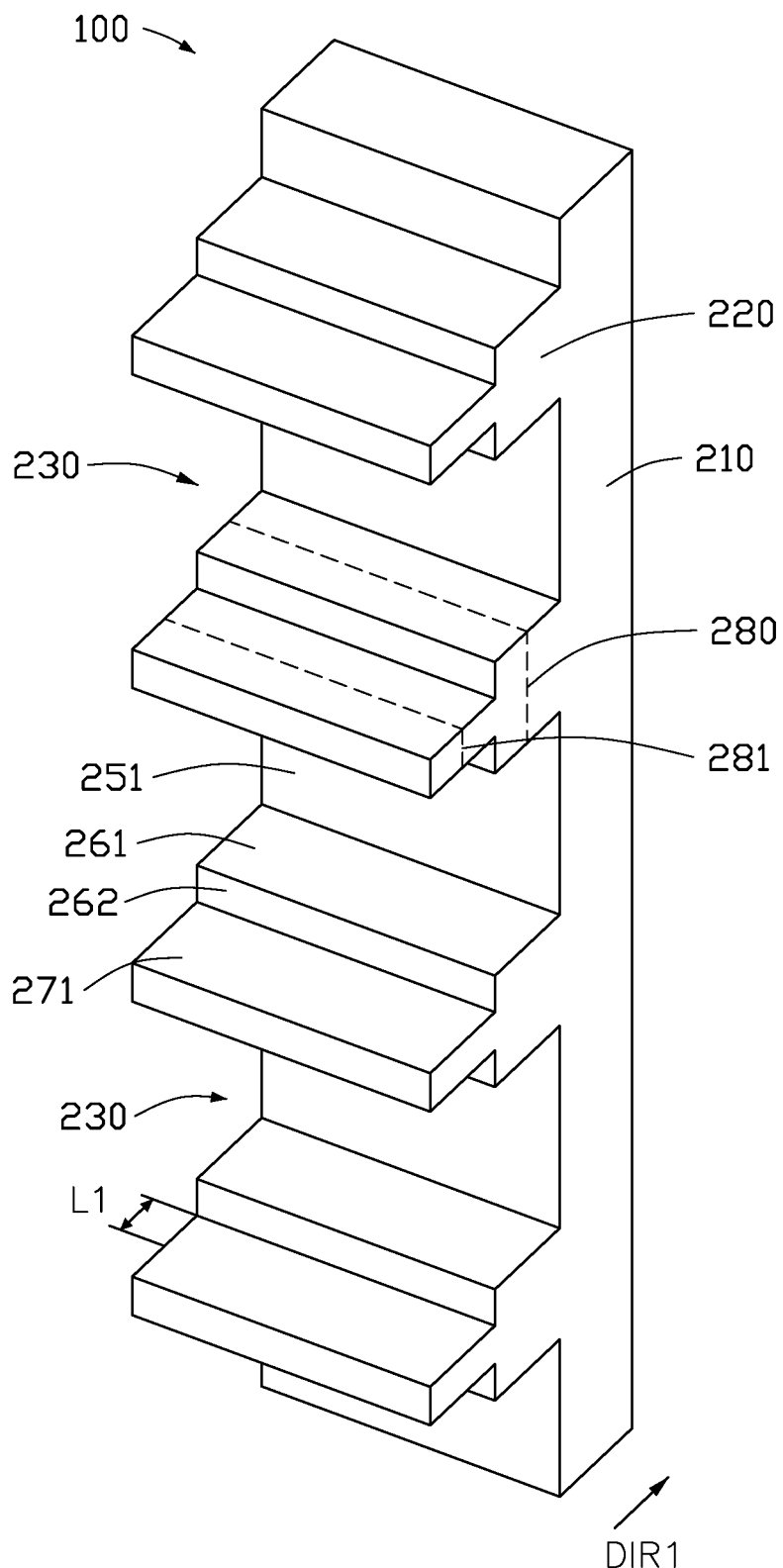
FIG. 2 is a perspective view of a portion of one of the wafer racks in the vertical wafer boat in FIG. 1.

FIG. 2 illustrates a perspective view of a portion 101 of one of the wafer racks 100 in the vertical wafer boat 10. The wafer rack 100 includes a vertical support member 210, a plurality of wafer support arms 220. The vertical support member 210 may be a cuboid pillar. The wafer support arms 220 are protrusions extending from a sidewall 251 of the vertical support member 210. The sidewall 251 of the vertical support member 210 and the plurality of wafer support arms 220 form a plurality of grooves 230. In other words, the grooves 230 are gaps between the wafer support arms 220.

In some implementations, the wafer support arm 220 includes a non-contact side 261, a lateral side 262 and a contact side 271. The contact side 271 is configured to hold a portion of the wafer. For example, a portion of the rim of the wafer may be placed on the contact side 271 with a predetermined length L1 away from the lateral side 262.

Figure 3:
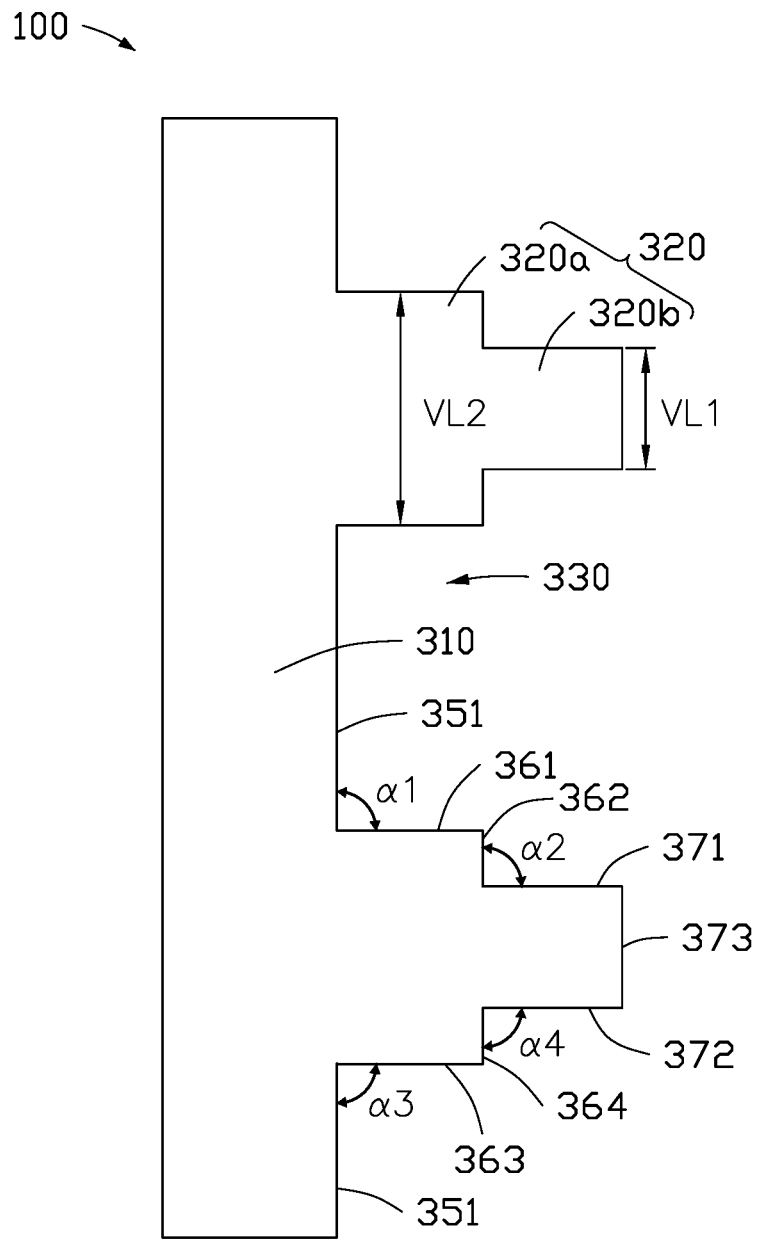
FIG. 3 is a cross-sectional view of a portion of one of the wafer racks in the vertical wafer boat in FIG. 1.

FIG. 3 illustrates a cross-sectional view of a portion of one of the wafer racks 100 in the vertical wafer boat 10. The wafer rack 100 includes a vertical support member 310, a plurality of wafer support arms 320, and a plurality of grooves 330.

In some implementations, the wafer support arm 320 includes a support body 320a and a ledge 320b.

The support body 320a has an upper portion and a lower portion. The upper portion includes a first non-contact side 361 (or an upper non-contact side) facing upward and an upper lateral side 362. The ledge 320b has a first contact side 371 facing upward, a second contact side 372 facing downward and a tip side 373 located between the first contact side 371 and the second contact side 372. The first contact side 371 and the second contact side 372 are located on opposing sides of the ledge 320bThe sidewall 351 and the first non-contact side 361 are perpendicular to each other; i.e., an angle α1 formed therebetween is 90 degrees. The upper lateral side 362 and the first contact side 371 are perpendicular to each other; i.e., an angle α2 formed therebetween is 90 degrees.

Symmetrical to the upper portion, the lower portion of the support body 320a includes a second non-contact side 363 (or a lower non-contact side) facing downward and a lower lateral side 364. The sidewall 351 and the second non-contact side 363 are perpendicular to each other; i.e., an angle α3 formed therebetween is 90 degrees. The lower lateral side 364 and the second contact side 372 are perpendicular to each other; i.e., an angle α4 formed therebetween is 90 degrees. In some examples, the first non-contact side 361 is parallel to the second non-contact side 363.

Please refer to FIGS. 2 and 3. As shown in FIG. 2, when viewed along a direction indicated by an arrow DIR1, a cross-sectional area (along a plane indicated by dash lines 281) of the ledge is smaller than a cross-sectional area (along a plane indicated by dash lines 280) of the support body. As shown in FIG. 3, the support body 320a is located between the vertical support member 310 and the ledge 320b. Centers of the support body and the ledge are horizontally aligned. A vertical thickness VL1 of the ledge is smaller than a vertical thickness VL2 of the support body.

Figure 4:
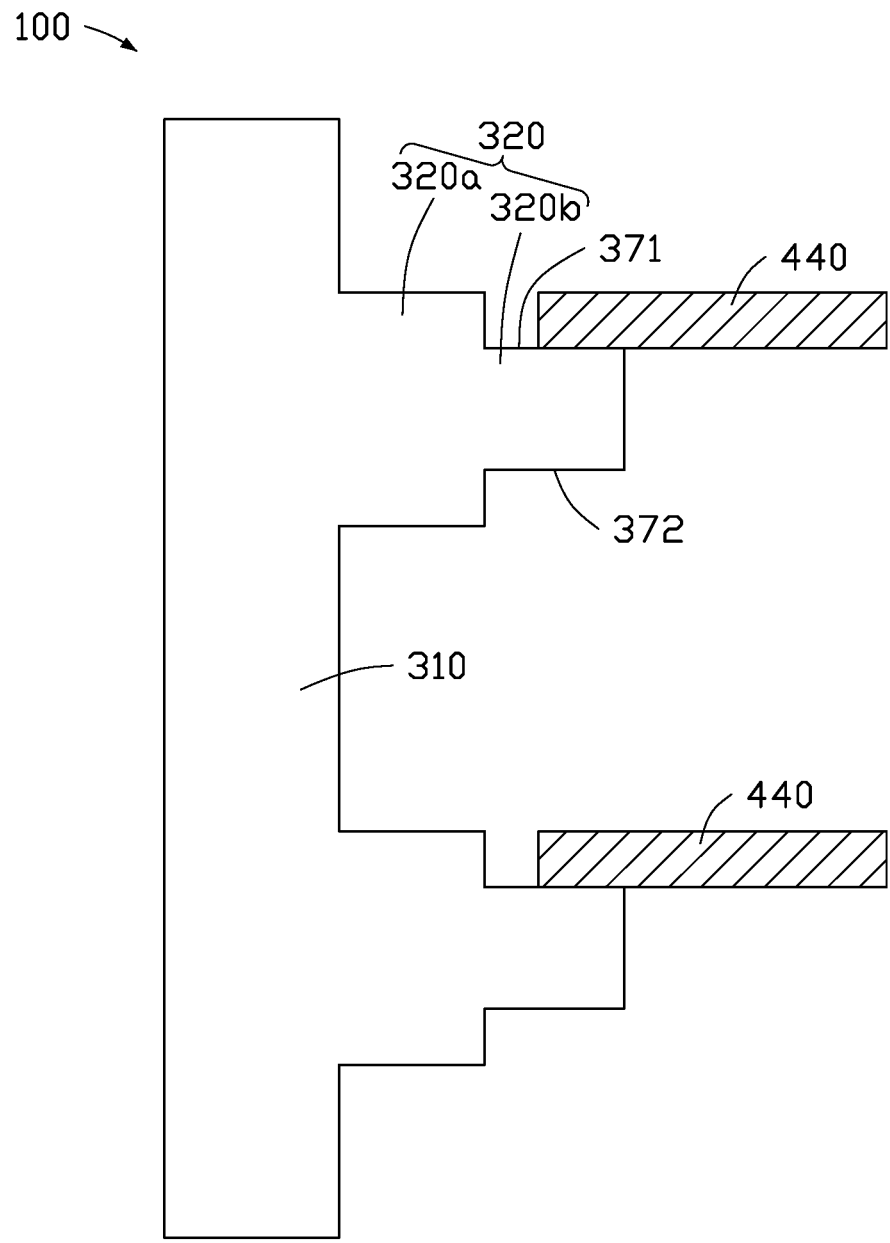
FIG. 4 is a cross-sectional view of the wafer rack loaded with wafers in accordance with an implementation of the present disclosure.

FIG. 4 illustrates a cross-sectional view of the wafer rack 100 loaded with wafers 440 in accordance with an implementation of the present disclosure. The wafer 440 may be placed on the ledge 320b by allowing the bottom of the rim of the wafer 440 to contact with the first contact side 371.

Figure 5:
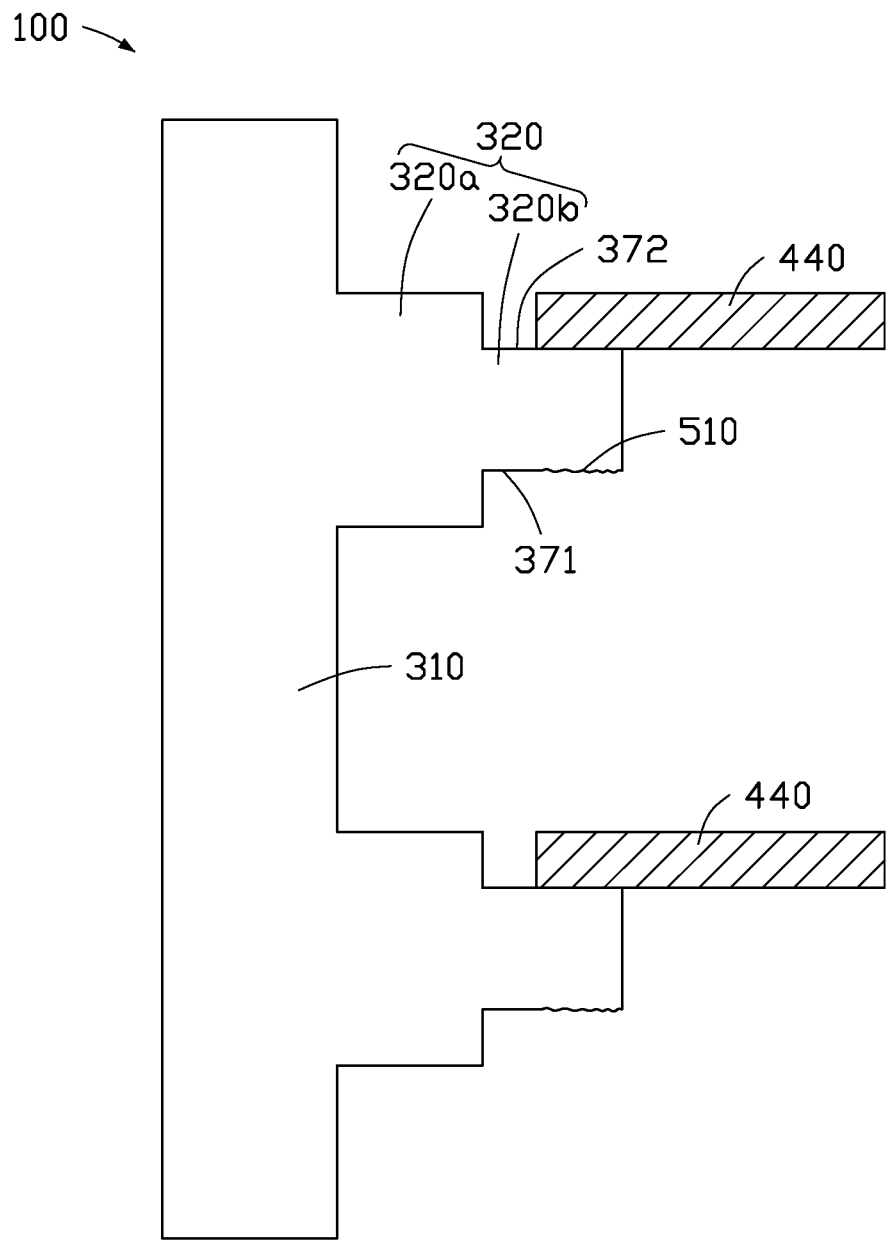
FIG. 5 is a cross-sectional view of the wafer rack reversed and loaded with wafers in accordance with an implementation of the present disclosure.

FIG. 5 illustrates a cross-sectional view of the wafer rack 100 reversed and loaded with wafers 440 in accordance with an implementation of the present disclosure. In some examples, at least one of the first contact side and the second contact side is configured to hold one of the plurality of wafers. Therefore, when damages occur on the first contact side 371 of the wafer rack 100, the wafer rack may be disposed upside down so as to allow the second contact side 372 to be available for use. As shown in FIG. 5, when damaged, the first contact side 371 shows an uneven surface 510, which may cause drop in yield rate of the wafers after the diffusion process. Since the wafer support arm 320 is horizontally symmetrical, reversing the wafer rack 100 prior to loading the wafers would replace of the first contact side 371 with the second contact side 372. Accordingly, the wafer 440 could be placed on the second contact side 372.

The terminology used herein is for the purpose of describing particular implementations only and is not intended to be limiting of implementations of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, actions, operations, elements, and/or components, but do not preclude the presence or addition of one or more other features, integers, steps, actions, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to implementations of the present disclosure in the form disclosed. Many modifications and variations will be apparent to those of ordinary skill in the art without departing from the scope and spirit of implementations of the present disclosure. The implementation was chosen and described in order to best explain the principles of implementations of the present disclosure and the practical application, and to enable others of ordinary skill in the art to understand implementations of the present disclosure for various implementations with various modifications as are suited to the particular use contemplated.

Although specific implementations have been illustrated and described herein, those of ordinary skill in the art appreciate that any arrangement which is calculated to achieve the same purpose may be substituted for the specific implementations shown and that implementations of the present disclosure have other applications in other environments. This present disclosure is intended to cover any adaptations or variations of the present disclosure. The following claims are in no way intended to limit the scope of implementations of the present disclosure to the specific implementations described herein.

Various examples have been described. These and other examples are within the scope of the following claims.

What is claimed is:

1. A wafer rack for holding a plurality of wafers, the wafer rack comprising:
   a vertical support member;
   a plurality of wafer support arms extending from a sidewall of the vertical support member, each of the wafer support arms including a support body and a ledge;
   an upper portion of the support body having an upper non-contact side and an upper lateral side; and
   a lower portion of the support body has a lower non-contact side and a lower lateral side, wherein the upper non-contact side is parallel to the lower non-contact side,
   wherein the support body is located between the vertical support member and the ledge, centers of the support body and the ledge are horizontally aligned, and a vertical thickness of the ledge is smaller than a vertical thickness of the support body;
   wherein the sidewall of the vertical support member and the plurality of wafer support arms form a plurality of grooves;
   wherein the upper lateral side and the lower lateral side of the support body are parallel to the sidewall of the vertical support member; and
   wherein the ledge has a first contact side, a second contact side, and a tip side, and the first contact side and the second contact side are located on opposing sides of the ledge.

2. The wafer rack of claim 1, wherein the upper lateral side of the support body is perpendicular to the first contact side of the ledge, and the lower lateral side of the support body is perpendicular to the second contact side of the ledge.

3. The wafer rack of claim 2, wherein at least one of the first contact side and the second contact side is configured to hold one of the plurality of wafers.

4. A vertical wafer boat for a diffusion process, the vertical wafer boat comprising:

a plurality of wafer racks, each of the plurality of wafer racks comprising:
   a vertical support member;
   a plurality of wafer support arms extending from a sidewall of the vertical support member, each of the wafer support arms including a support body and a ledge;
   an upper portion of the support body having an upper non-contact side and an upper lateral side; and
   a lower portion of the support body has a lower non-contact side and a lower lateral side, wherein the upper non-contact side is parallel to the lower non-contact side,
   wherein the support body is located between the vertical support member and the ledge, centers of the support body and the ledge are horizontally aligned, and a vertical thickness of the ledge is smaller than a vertical thickness of the support body;
   wherein the sidewall of the vertical support member and the plurality of wafer support arms form a plurality of grooves;
   wherein the upper lateral side and the lower lateral side of the support body are parallel to the sidewall of the vertical support member; and
   wherein the ledge has a first contact side, a second contact side, and a tip side, and the first contact side and the second contact side are located on opposing sides of the ledge.

5. The vertical wafer boat of claim 4, wherein the upper lateral side of the support body is perpendicular to the first contact side of the ledge, and the lower lateral side of the support body is perpendicular to the second contact side of the ledge.

6. The vertical wafer boat of claim 5, wherein at least one of the first contact side and the second contact side is configured to hold a portion of a wafer.

7. The vertical wafer boat of claim 4, wherein the diffusion process is a low pressure chemical vapor deposition (LPCVD) process.

8. The vertical wafer boat of claim 4, wherein the vertical wafer boat is configured to be vertically placed into a vertical reactor.

9. The vertical wafer boat of claim 4, wherein the vertical support member is a cuboid pillar.

10. The vertical wafer boat of claim 4, further comprising:
   a top plate; and
   a bottom plate,
   wherein the plurality of wafer racks is configured to be connected to the top plate and the bottom plate.

\* \* \* \* \*